United States Patent [19]
Ijichi et al.

[11] Patent Number: 5,155,738
[45] Date of Patent: Oct. 13, 1992

[54] SEMICONDUCTOR LASER ELEMENTS

[75] Inventors: Teturo Ijichi, Mitsuzawanishimachi; Hiroshi Okamoto, Tokyo, both of Japan

[73] Assignee: The Furakawa Electric Co., Ltd., Tokyo, Japan

[21] Appl. No.: 606,812

[22] Filed: Oct. 31, 1990

[30] Foreign Application Priority Data

Oct. 31, 1989 [JP] Japan .................. 1-284535
Nov. 27, 1989 [JP] Japan .................. 1-307339
Jan. 29, 1990 [JP] Japan .................. 2-18449

[51] Int. Cl.$^5$ .............................. H01S 3/19
[52] U.S. Cl. .................... 372/45; 372/46; 357/4; 357/17
[58] Field of Search ............ 372/45, 46; 357/16, 357/17, 4

[56] References Cited

U.S. PATENT DOCUMENTS

| 4,887,274 | 12/1989 | Hayakawa et al. | 372/45 |
| 4,941,146 | 7/1990 | Kobayashi | 372/45 |
| 4,984,242 | 1/1991 | Scifres et al. | 372/45 |
| 5,016,252 | 5/1991 | Hamada et al. | 372/45 |

Primary Examiner—Georgia Y. Epps
Attorney, Agent, or Firm—Foley & Lardner

[57] ABSTRACT

A semiconductor laser element having a GaAs substrate formed thereon with an active layer of a strained quantum well construction provided with an $In_xGa_{1-x}As$ strained quantum well layer and a GaAs barrier layer and clad layers arranged up and down of said active layer through an epitaxial growth means. A lattice mismatching rate of the clad layer with respect to the substrate is less than $10^{-3}$.

5 Claims, 6 Drawing Sheets

SEMICONDUCTOR LASER ELEMENTS

BACKGROUND OF THE INVENTION

1. Field of the Invention

The present invention relates to semiconductor laser elements of a strained quantum well type and a method for the production of the semiconductor laser elements.

2. Description of Prior Art

A semiconductor laser element formed on a GaAs substrate with an active layer of a strained quantum well construction provided with an $In_xGa_{1-x}As$ ($x=0.0$ to 0.5) strained quantum well layer and a GaAs barrier layer is expected as a light source of wavelength of 0.9 to 1.1 μm which just comprises of a raving in a conventional lattice matched type laser such as GaAs/AlGaAs and InAsP/InP.

In case of semiconductor laser elements, as a clad for confining carrier and light in an active layer, a semiconductor should be used which has a permeability with respect to light having an oscillation waveform, is smaller in refractive index than that of the active layer (or a layer for confining light near the active layer), and is large in energy gap.

In the conventional semiconductor laser element of an $In_xGa_{1-x}As$ strained quantum well type, $Al_wGa_{1-w}As$ of $w>0.2$ is used as a clad.

Figure 8:
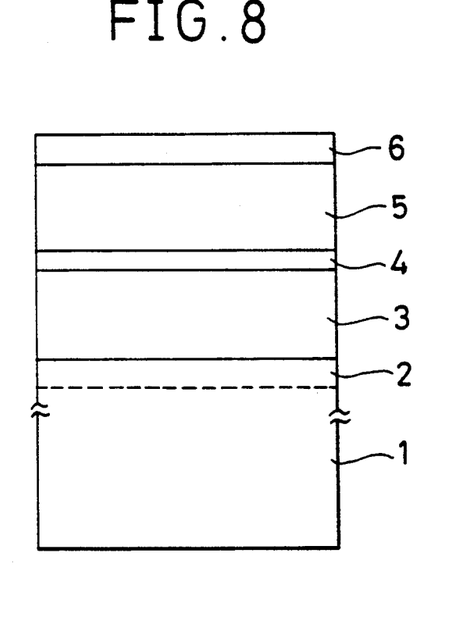
FIG. 8 is a sectional view showing a double hetero type layer construction as a conventional semiconductor laser element.

FIG. 8 shows a conventional semiconductor laser element of an $In_xGa_{1-x}As$ strained quantum well type.

In FIG. 8, an n-type GaAs substrate 1 having approximately 350 μm of thickness is formed thereon with an n-type GaAs buffer layer 2 having approximately 0.5 μm of thickness and an n-type $Al_{0.3}Ga_{0.7}As$ clad layer 3 having approximately 1.5 μm of thickness through epitaxial growth means such as MBE method or MOCVD method.

Further, in FIG. 8, the n-type GaAs substrate 1 is formed at its predetermined position with an essential portion 4 including an active layer provided with an $In_{0.35}Ga0.65As$ strained quantum well layer, a GaAs barrier layer, etc., and a light confining layer, a p-type $Al_{0.3}Ga0.7As$ clad layer 5 having 1.5 μm of thickness and a p-type contact layer 6 having 0.2 μm of thickness.

Figure 9:
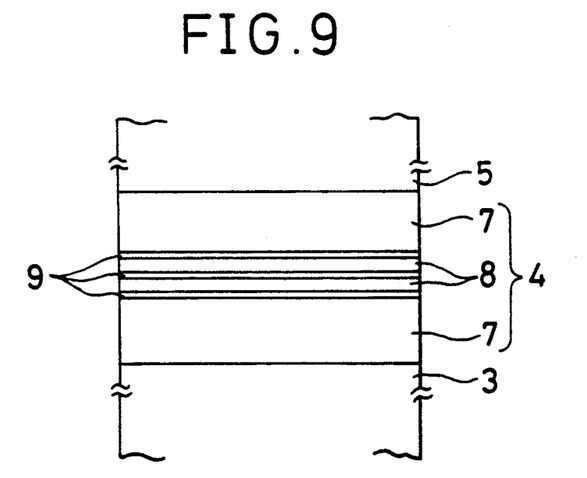
FIG. 9 is an enlarged view of essential parts of a semiconductor laser element shown in FIG. 8.

The details of the essential part 4 is clearly shown in FIG. 9.

In FIG. 9, two upper and lower GaAs light confining layers 7 has 1500 Å of thickness, a GaAs barrier layer 8 between these light confining layers 7 has 100 Å of thickness and an $In_{0.35}Ga_{0.65}$ strained quantum well layer 9 has a thickness of 40 Å.

A double hetero construction formed on the GaAs substrate 1 is formed with a current restricting layer and an electrode and is applied with microworking such as element separation to prepare a laser chip.

One example of prior art has been described above. The semiconductor laser element has various modes such as a ratio of composition of mixed crystal, the number of layers of strained quantum wells, thickness of the layers, etc. As the light confining layer, there is well known a GRINSHC construction using AlGaAs in which the ratio of Al composition is parabolic.

Next, the process for working the bridge waveguide path into a strained quantum well type semiconductor laser element will be described hereinafter with reference to FIGS. 10(a) to 10(d).

Figure 10A:
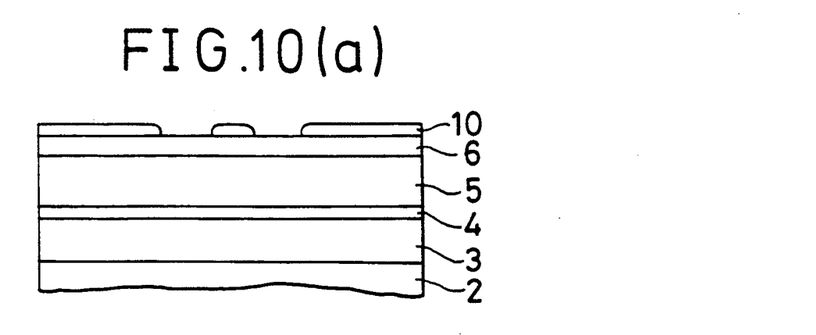
FIG. 10(a) to 10(d) are explanatory views showing the steps of preparing a conventional double hetero construction.

In the process shown in FIG. 10(a), a resist 10 is patterned on a p-type GaAs contact layer 6 through means such as photolithgraphy.

Figure 10B:
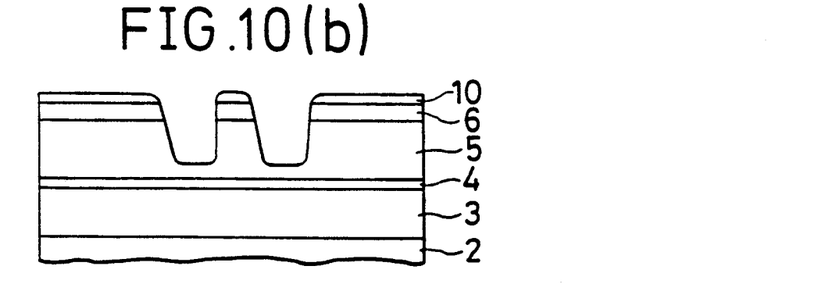

In the process shown in FIG. 10(b), the resist 10 is used as a mask. The GaAs contact layer 6 of a double hetero construction and the upper clad layer 5 are subjected to etching till the depth of the etching reaches about 0.2 m of the active layer 4.

As etching liquids in etching AlGaAs/GaAs type, there can be used a mixed solution of sulfuric acid and hydrogen peroxide, a mixed solution of tartaric acid and hydrogen peroxide, a mixed solution of ammonia and hydrogen peroxide or dry etching such as chlorine (for example, reactive ion beam etching).

Figure 10C:
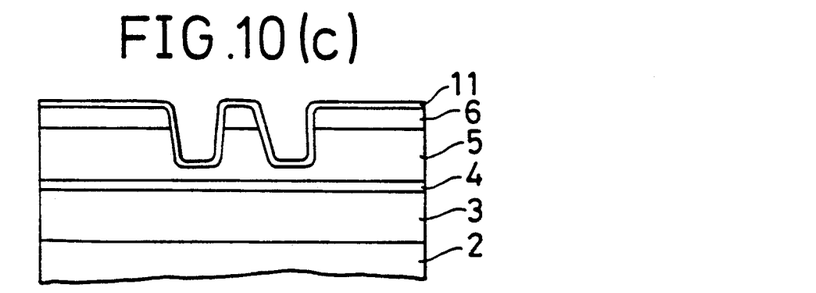

In the process of FIG. 10(c), means such as spattering is used to form a surface of an epitaxial film with an etching mask 11 in the form of a film such as $SiO_2$, SiN, etc.

Figure 10D:
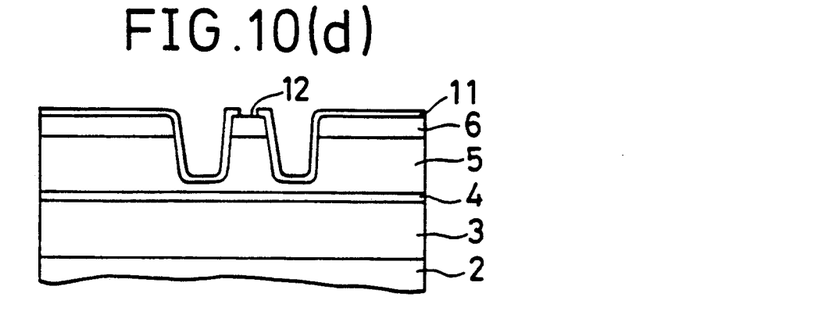

In the process of FIG. 10(d), means such as photolithgraphy is used to form an etching portion 12 in a stripe-like $SiO_2$ as a patterned resist mask.

In the thereafter processes, electrodes are formed on both upper and lower surfaces of a laminate construction, and microworking such as element separation is applied thereto.

The technical process with regard to the aforementioned semiconductor laser element include oxidation of Al, compressive stress from a substrate lattice and defective etching process, which will be described hereinafter.

Oxidation of Al

Main uses of laser having 0.9–1.1 μm of waveform are excitation of a fiber amplifier in which rare earth such as Er is doped, or a visual light source in combination with SHG. In case of these semiconductor products, a prolonged service life is required at high output in excess of scores of mW.

However, the conventional strained quantum well type semiconductor laser cannot fulfill such a requirement as described above since it uses the aforementioned AlGaAs as a clad layer, for the following reasons.

Among elements (for example, In, Al, Ga, As, P, Sb, etc.) constituting a compound semiconductor, Al is an element which tends to be oxidized most easily. For example, when a regrowth surface is made by an embedding growth means during fabrication of a laser chip, oxidation of Al tends to occur.

Such an Al oxidation results in the occurrence of a non-light emitting center and degradation of crystallization, resulting in a failure to obtain a semiconductor laser having excellent laser characteristics.

Furthermore, in case where a plait surface is used as a laser end, oxidation of the end progresses during use of laser to bring forth a lowering of refractive index and an increase of absorption, deteriorating laser characteristic.

The semiconductor laser increases its temperature particularly during laser operation at high pouring, the progress of oxidation is sped up.

Means has been proposed to remove oxygen and water content in the process for the fabrication of laser in order to suppress oxidation of Al. However, this requires much labor and a device for protection of the end should be made.

Because of this, in the prior art, it is not possible to easily obtain a laser having a long service life under the using conditions of high output.

Compressive stress from substrate lattice

In a double hetero construction for laser diode using a conventional $IN_xGa_{1-x}As/GaAs$ strained quantum well construction as an active layer, semiconductors having a larger lattice constant than that of GaAs substrate are laminated.

Specifically, the lattice constant of the GaAs substrate is 5.65 Å whereas $Al_wGa_{1-w}As$ has a large lattice constant, 0.14 w % and $In_xGa_{1-x}As$ has a large lattice constant, 7.3 x %.

For instance, when compositions of $In_xGa_{1-x}As$ and $Al_wGa_{1-w}As$ are $x=0.35$ and $w=0.3$, respectively, lattice nonmatching rates with respect to GaAs are $+2.65\%$ and $+0.04\%$, respectively.

In this case, the $Al_wGa_{1-w}As$ layer is small in the lattice non-matching rate with respect to GaAs but is thick, 3 μm (about ten thousand atom layer), and $In_xGa_{1-x}As$ layer is thin, 120 Å (about 40 atom layer) but the lattice nonmatching rate with respect to GaAs is large and therefore, a laminate of the $Al_wGa_{1-w}As$ layer and $In_xGa_{1-x}As$ layer receives a compressive stress from the substrate. This compressive stress causes an occurrence of transition and slip in the active layer of the strained quantum well construction during high pouring and laser operation of high excitation.

As a result, the semiconductor laser element tends to give rise to DLD (dark line defect), lowering the laser oscillation life.

Defective etching process

In order to control a lateral mode, in the semiconductor laser element it is necessary to employ a guide wave mechanism of either gain guide wave type or refractive index guide wave type.

With respect to these guide wave types, various laser element constructions have been proposed. In case of the strained quantum well type semiconductor laser element, a lattice mismatching is present between a well and a barrier, and therefore, an active layer is subjected to mesa etching to have a stripe configuration, after which a layer is embedded therein and grown.

However, in the laser element such as BH construction, a defect such as transition tends to occur in the embedded growth layer near the active layer, making it difficult to obtain a semiconductor laser element having a long life.

On the other hand, in the ridge waveguide laser element, the element can be produced leaving an active layer to be flat, which is therefore one of laser elements suitable for the strained quantum well type.

This ridge waveguide laser element can be produced by means illustrated in FIG. 10.

Among the steps shown in FIGS. 10(a) to 10(b), the mesa forming process in FIG. 10(b) is important, in order to control the lateral mode, to accurately control the distance between the mesa bottom and the active layer and in order not to produce scattering of light, to finish the mesa bottom flat.

However, severe control is required with respect to concentration of temperature of etching liquid in accurately controlling the depth of etching, and similarly, concentration and temperature of etching liquid should be maintained uniformly so that the depth of etching is not uneven within the etching surface even when etching is carried out. Therefore, the technical difficulty in the important process increases.

As a result, it is difficult to produce a semiconductor laser element having an excellent laser characteristic with good reproduceability, lowering the yield of good products.

In view of the aforesaid technical processes, the present invention provides a semiconductor laser element which exhibits an excellent laser characteristic for a long period of time and a method for the production of the semiconductor laser element.

SUMMARY OF THE INVENTION

According to a first feature (claim 1) of the present invention, there is provided a semiconductor laser element comprising an active layer of a strained quantum well construction provided with an $In_xGa_{1-x}As$ strained quantum well layer and a GaAs barrier layer and clad layers arranged up and down of said active layer, said active layer and said clad layers being formed on a GaAs substrate through an epitaxial growth means, said clad layer being formed of $In_zGa_{1-z}As_yP_{1-y}$.

In this case, it is desired that the lattice mismatching rate of the clad layer to the substrate be less than $10^{-3}$ as described in claim 2.

According to a further feature (claim 3), there is provided a semiconductor (claim 1) wherein a stress relieving layer comprising $In_{1-z}Ga_zP$ ($x=0.51$) is interposed between said active layer and said upper and lower clad layers.

According to another feature (claim 4), there is provided a semiconductor laser element comprising an active layer of a strained quantum well construction provided with an $In_xGa_{1-x}As$ strained quantum well layer and a GaAs barrier layer and clad layers arranged up and down of said active layer, said active layer and said clad layers being formed on a GaAs substrate through an epitaxial growth means, said clad layer being formed of InGaP, said clad layer having a GaAs etching stop layer inserted therein.

Also in this case, it is desired that the lattice mismatching rate of the clad layer to the substrate be less than $10^{-3}$ as described in claim 4.

According to another feature (claim 6) of the present invention, there is provided a method for the production of a semiconductor laser element comprising an active layer of a strained quantum well construction provided with an $In_xGa_{1-x}As$ strained quantum well layer and a GaAs barrier layer, InGaP clad layers arranged up and down of said active layer and a GaAs etching stop layer inserted into said clad layer, said active layer, said clad layers and said etching stop layer being formed on a GaAs substrate through an epitaxial growth means, the method comprising the steps of etching an InGaP layer to a GaAs layer with an etching liquid containing either sulfuric acid, tartaric acid or ammonia and hydrogen peroxide, and etching an InGaP layer to a GaAs layer with an etching liquid containing hydrochloric acid but not containing hydrogen peroxide.

Function of the present invention will be described.

(1) Semiconductor laser element of claim 1:

In the semiconductor laser element, in order that clad layers provided up and down of the active layer may sufficiently confine light and carriers in the strained quantum well active layer and a light confining layer, it is necessary that the former is lattice matched with the GaAs substrate, the refractive index with respect to light having 0.9 to 1.1 μm of wavelength is $Al_wGa_{1-w}As$ (w=0.5–0.6) and the energy gap is large equal to $Al_w$-$Ga_{1-w}As$ (w=0.5–0.6).

In the semiconductor laser element according to claim 1, each of upper and lower clad layers of the active layer is formed of $In_zGa_{1-z}As_yP_{1-y}$.

The $In_zGa_{1-z}As_yP_{1-y}$ is fulfilled with the aforesaid condition as the clad layer by adjusting the composition, and does not contain Al, and therefore, problems caused by Al oxidation are not present.

Of course, in the strained quantum well type semiconductor laser element not only the clad layer but also all the structural members do not contain Al, which is therefore desirable.

(2) In the semiconductor laser element, if the mismatching rate of the clad layer with respect to the substrate is less than $10^{-3}$ as in claim 2, both the members become substantially completely lattice-matched.

(3) In the semiconductor laser element according to claim 3:

The lattice constant a of $In_{1-z}Ga_zP$ is given by the following formula (1) according to Vegad rule. When z=0.51, lattice matching with GaAs is obtained, and when z>0.51, the lattice constant is smaller than that of GaAs.

$$a = 5.869 - 0.42 \times z \ldots \quad (1)$$

In case of the semiconductor laser element according to claim 3, an $In_{1-z}Ga_zP$ stress relieving layer having z which is smaller in lattice constant than that of GaAs substrate is provided near the strained quantum well active layer.

It is desired that the $In_{1-z}Ga_zP$ stress relieving layer be designed so that an average lattice constant a of an epitaxial layer given by the following formula (2) is equal to the lattice constant of the GaAs substrate.

$$a = \Sigma a_i t_i / \Sigma t_i \ldots \quad (2)$$

$a_i$: lattice constant of each epitaxial layer $t_i$: thickness of each epitaxial layer Since the thus designed epitaxial layer is lattice-matched to the substrate, stress in an interface between the substrate and the epitaxial layer hardly occurs, and occurrence of transition at the interface can be suppressed.

Accordingly, the case of strained quantum well type semiconductor laser element, the service life is long.

(3) Semiconductor laser element of claim 4:

The semiconductor laser element according to claim 4 is configured by making use of properties that InGaP is lattice-matched to GaAs and InGaP and GaAs can be subjected to selective etching at different speeds.

That is, in a double hetero construction for laser having an active layer of a strained quantum well construction with a ridge waveguide type, a clad layer is formed of InGaP, and A GaAs etching stop layer is inserted at a control position of an etching depth in a mesa forming step into the InGaP clad layer, and therefore, when such a double hetero construction is subjected to selective etching processing, it is possible to accurately control the distance between the mesa bottom and the active layer.

(5) Also in the case of the semiconductor laser element, if the lattice mismatching rate of the clad layer to the substrate plate is less than $10^{-3}$ as in claim 5, both the members become substantially completely lattice-matched.

(6) Method for the production of a semiconductor laser element according to claim 6:

The method according to claim 6 is the method for producing the semiconductor laser element.

In the mesa forming step, either a mixed liquid of sulfuric acid and hydrogen peroxide, a mixed liquid of tartaric acid and hydrogen peroxide or a mixed liquid of ammonia and hydrogen peroxide is used to apply etching to a GaAs contact layer, and an etching liquid containing hydrochloric acid but not containing hydrogen peroxide is used to apply etching to an InGaP clad layer.

In case of one of said etching liquids containing hydrogen peroxide, the etching speed varies depending on concentration and temperature. However, the etching speed with respect to GaAs is normally 20 times or more of the etching speed with respect to InGaP.

In case of the other etching liquid not containing hydrogen peroxide, the etching speed with respect to GaAs is normally one ten-thousandth of the etching speed with respect to InGaP.

Accordingly, in the mesa forming step in the method according to claim 6, first, the aforementioned one etching liquid containing hydrogen peroxide can be used to selectively etch the GaAs layer alone. Subsequently, the other etching liquid can be used to selectively etch the InGaP clad layer up to the GaAs etching stop layer.

DETAILED DESCRIPTION OF THE PREFERRED EMBODIMENTS

A method for the production of a semiconductor laser element according to the present invention will be described in connection with the embodiments shown.

Figure 1:
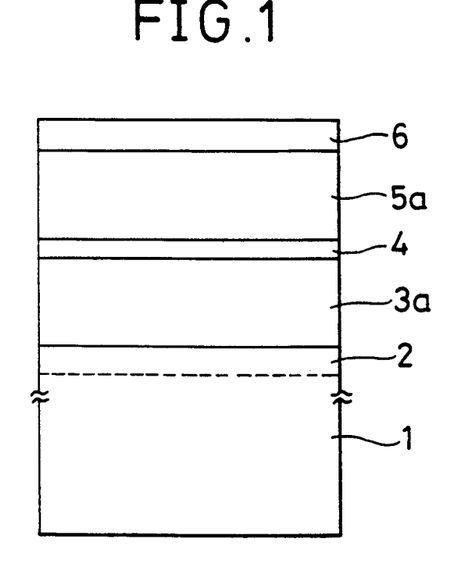
FIG. 1 is a sectional view showing a double heter type layer construction as a first embodiment of a semiconductor laser element according to the present invention.
Figure 2:
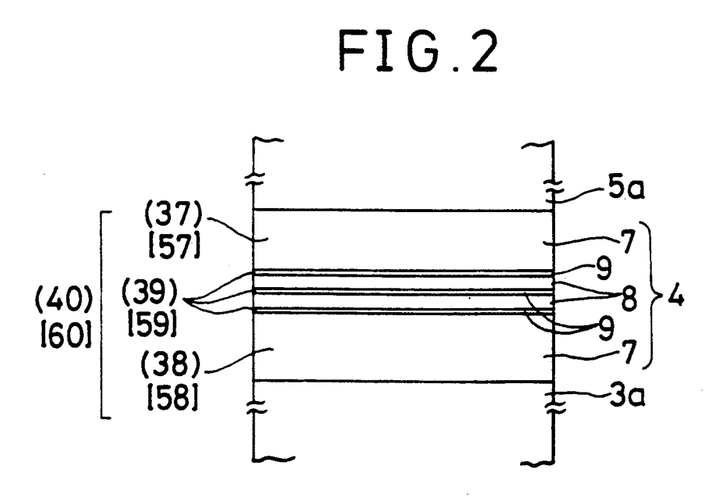
FIG. 2 is an enlarged view of essential parts of the semiconductor laser shown in FIG. 1.

FIGS. 1 and 2 show a first embodiment of a semiconductor laser element according to the present invention. A semiconductor laser element of the first embodiment has a structure which will be described below.

In FIG. 1, an n-type GaAs substrate 1 having about 350 μm of thickness is formed thereon with a n-type GaAs buffer layer 2 having about 0.5 μm of thickness and an n-type $In_{0.49}Ga_{0.51}As$ clad layer 3a having about 1.5 μm of thickness through epitaxial growth means such as MBE method and MOCVD method and further at a predetermined position thereof with a main portion 4 including an active layer provided with an $In_{0.35}Ga_{0.65}As$ strained quantum well layer, a GaAs barrier layer and the like and a light confining layer, a p-type $In_{0.49}Ga_{0.51}As$ clad layer 5a having about 1.5 μm of thickness and a p-type contact layer 6 having about 0.2 μm of thickness.

With the structure of the main portion 4 clearly shown in FIG. 2, two upper and lower GaAs light confining layers 7 have 1500 Å of thickness, a GaAs barrier layer 8 between the light confining layers 7 has 100 Å of thickness, and an $In_{0.35}Ga_{0.65}As$ distortion quantum well layer 9 has 40 Å of thickness.

The double hetero construction uniformly formed on the GaAs substrate 1 is formed with a current restricting layer and an electrode as is known, and is applied with microworking such as element separation to prepare a laser chip.

The semiconductor laser element of the present invention illustrated in FIGS. 1 and 2 is different from that shown in FIGS. 8 and 10 in that one clad layer 3a is formed of the p-type In0.49Ga0.51As and the other clad layer 5a is formed of the n-type $In_{0.49}Ga_{0.51}As$.

The front electrode type semiconductor laser element having the construction as described above has 140 A/cm² of oscillation threshold current density during the pulse drive under room temperature.

This value is equal to that in which both clad layers are formed of $Al_{0.50}Ga_{0.5}As$.

Figure 3:
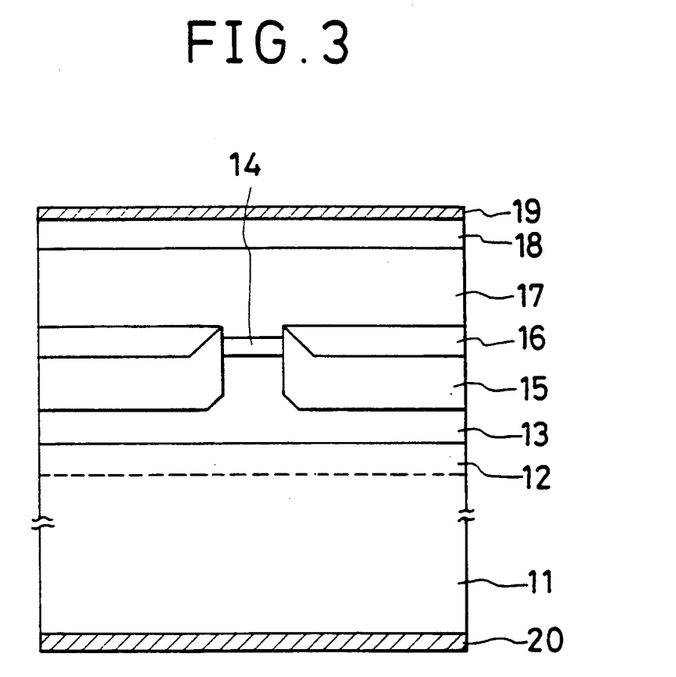
FIG. 3 is a sectional view showing an embeded type layer construction as a second embodiment of a semiconductor laser element according to the present invention.

FIG. 3 shows a second embodiment of a semiconductor laser element according to the present invention, and an embedded type semiconductor laser element of the second embodiment has the structure which will be described below.

In FIG. 3, an n-type GaAs substrate 11 is formed thereon with a main portion 14 including an n-type GaAs buffer layer 12, an n-type InGaP clad layer 13, an active layer of a strained quantum well construction and a light confining layer, a p/n junction p-type InGaP blocking layer 15 and an n-type InGaP blocking layer 16, a p-type InGaP clad layer 17 and a p-type GaAs cap layer 18 through the aforementioned epitaxial growth means and etching means and further on the back side thereof with a p-type electrode 19 of AuZn type, the p-type GaAs cap layer 18 being formed on the upper surface thereof with an n-type electrode 20 of AuGeNi type.

In FIG. 3, the main portion 14 including an active layer of distortion quantum well construction and a light confining layer has 1.5 μm of width and 600 μm of length of resonance unit, and a cleavage surface thereof is in the form of a mirror without a protective film.

When the semiconductor laser element of the second embodiment shown in FIG. 3 is operated under room temperature, CW oscillation is obtained at pouring of 7 mA, and output of 100 mW is obtained at pouring of 600 mA. After laser drive 50 mW and 200 hours, the I-L characteristic remains unchanged. A long service life is maintained under the high output state.

While in the second embodiment, InGaP has been used as a clad layer, it is to be noted that even if InGaAsP having 1.5 eV or more of energy gap is used as a clad layer, light and carrier can be confined.

Since InGaP as well as InGaAsP contain no Al, oxidation of regrowth interface and cleavage surface is hard to occur and accordingly a laser of long service life can be prepared.

With respect to InGaAsP, lattice matching with the GaAs substrate may be provided to a degree that transition does not occur.

In the second embodiment, the film thickness of layers, composition, and the number of strained quantum well layers are not limited to the aforementioned contents and the illustrated examples.

In the second embodiment, the GRIN construction in which the composition of InGaAsP is stepwisely changed is sometimes employed as a light confining layer.

In case of the semiconductor laser element of the second embodiment illustrated in FIG. 3, the cleavage surface is sometimes subjected to coating for the purpose of improving low threshold, efficiency, and output.

Figure 4:
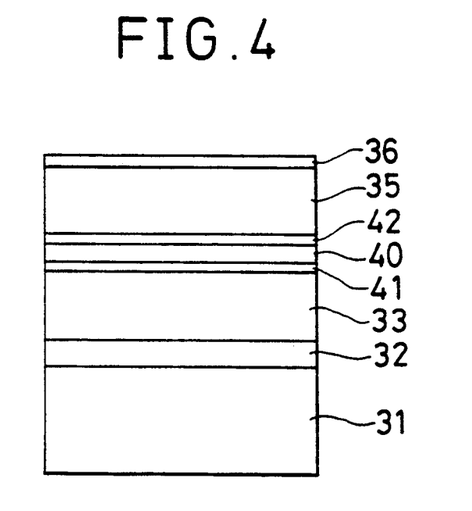
FIG. 4 is a sectional view showing a double hetero type layer construction as a third embodiment of a semiconductor laser element according to the present invention.

FIG. 4 shows a third embodiment of a semiconductor laser element according to the present invention. The semiconductor laser element of the third embodiment has the structure described below.

In FIG. 4, an n-type GaAs substrate 31 having 350 μm of thickness formed thereon with an n-type GaAs buffer layer 32 having 0.5 μm of thickness, an n-type $In_{0.49}Ga_{0.51}As$ clad layer 33 having 1.5 μm of thickness, a p-type $In0.47Ga_{0.35}P$ stress relieving layer having 0.12 μm of thickness, a main portion 40 including an active layer and a light confining layer, an n-type $In_{0.47}Ga_{0.53}$ stress relieving layer 42 having 0.12 μm of thickness, a p-type $In_{0.49}Ga_{0.51}As$ clad layer 35 having 0.5 μm of thickness, and a p-type contact layer 36 having 0.2 μm of thickness in order through the aforementioned epitaxial growth means.

The structure of the main portion 40 in FIG. 4 is the same as that mentioned in FIG. 2. Parts constituting the main portion 40 are indicated by reference numeral with ( ) in FIG. 2.

That is, in FIG. 2 also showing the main portion 40 of FIG. 4, two GaAs light confining layers 37 positioned up and down have 1500 Å of thickness, each GaAs barrier layer 38 between these light confining layers 7 has 100 Å of thickness, and each $In_{0.35}Ga_{0.65}As$ strained quantum well layer 39 has 40 Å of thickness.

An average lattice constant between an $In_{0.35}Ga_{0.65}As$ strained quantum well layer 39 having 40 Å thickness and +2.5% of lattice mismatching rate and an $In_{0.47}Ga_{0.53}P$ stress relieving layers 41 and 42 having 1200 Å thickness and −0.13% of lattice mismatching rate is substantially equal to that of the GaAs substrate 31.

Let $\bar{\Delta} a/a_o$ be the lattice mismatching rate of the expitaxial growth layer with respect to the substrate 31, this value is very small as shown by the formula (3) below.

$$\overline{\Delta a/ao} = 1.2 \times 10^{-6} \ldots \quad (3)$$

As a comparative example 1, as shown in FIGS. 8 and 9, on an n-type GaAs substrate 1 having 350 μm of thickness were laminated in order of an n-type GaAs buffer layer 2 having 0.5 μm of thickness, an n-type $Al_{0.3}Ga_{0.7}As$ clad layer 3 having 1.5 μm of thickness, a main portion 4 including an active layer and a light confining layer, a p-type $Al_{0.3}Ga_{0.7}As$ clad layer 5 having 1.5 μm of thickness, and a p-type contact layer having 0.2 μm of thickness to prepare a predetermined specimen.

In this case, the GaAs light confining layer 7 of the main portion 4 has 1500 Å of thickness, the GaAs barrier layer 8 between the light confining layers 7 has 100 Å of thickness, and the $In_{0.35}Ga_{0.65}As$ strained quantum well layer 9 has 40 Å of thickness. Each double hetero construction of the third embodiment and comparative example 3 was worked into a complete electrode type laser element having 300 μm of cavity length and they were pulse oscillated under room temperature. The oscillation threshold current density was measured to obtain results given in Table 1 below.

TABLE 1

|  | Threshold current density (A/cm²) |
|---|---|
| Third Emdodiment | 280 ± 20 |
| Comparative Example 1 | 280 ± 20 |

Figure 5:
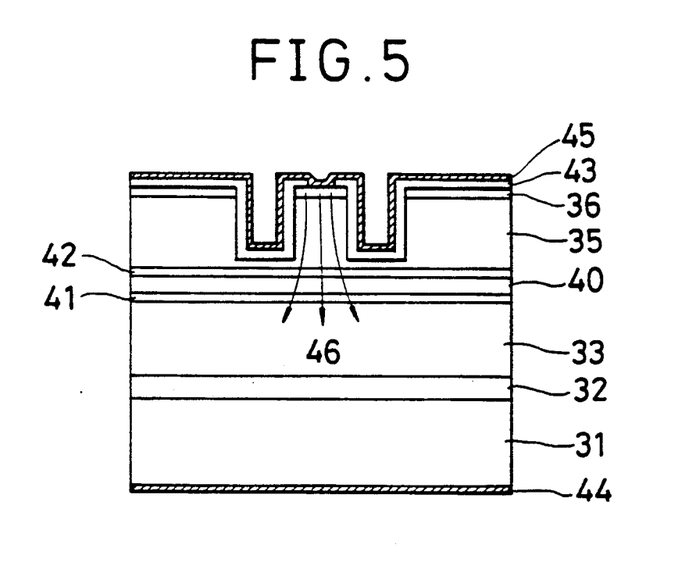
FIG. 5 is a sectional view showing a ridge waveguide layer construction as a fourth embodiment of a semiconductor laser element according to the present invention.

FIG. 5 shows a fourth embodiment of a semiconductor laser element according to the present invention.

The semiconductor laser element of the fourth embodiment shown in FIG. 5 is provided with a $SiO_2$ insulating film 43 and alloy electrodes 44 and 45 while in the third embodiment, the element is prepared in the form of ridge wave guide type strained quantum well type.

In FIG. 5, reference numeral 46 denotes a flow of current.

In Comparative Example 2 to be compared with the fourth embodiment, the element of the Comparative Example 1 is formed into the strained quantum well type of the ridge wave guide type similar to that of the fourth embodiment.

With respect to the elements of the fourth embodiment and Comparative Example 2, the threshold current density and life were measured to obtain the result shown in Table 2 below.

TABLE 2

|  | Threshold current density (mA) | Life |
|---|---|---|
| Fourth Embodiment | 12 | 2000 hr or more |
| Comparative Example 2 | 13 | 500 hr |

The life in Table 2 was determined according to 10% (30° C.) rise of drive current by APC of 50mW.

It is found from the above measured results that the threshold current and life of the strained quantum well type semiconductor laser element according to the present invention were remarkably improved.

In case of the third and fourth embodiments, as the clad layer, $Al_wGa_{1-w}As$ of $w>0.3$ is sometimes used.

In the third and fourth embodiment, it is desired that the average lattice constant of the epitaxial layer is equal to that of the GaAs substrate. However, an allowable range of the mismatching rate is approximately $|\Delta a/ao| < 1.2 \times 10^{-4}$.

Thickness of layers, composition and number of strained quantum well layers are not limited thereto but the GRIN construction is sometimes employed as a light confining layer.

Figure 6:
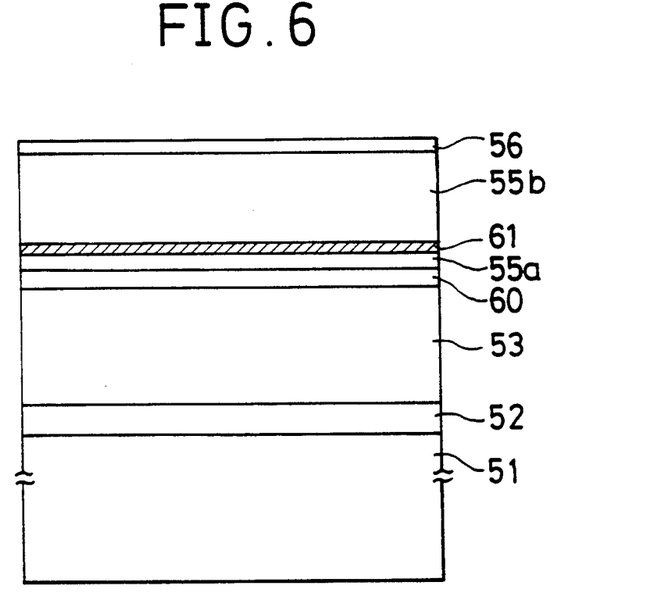
FIG. 6 is a sectional view showing a double hetero type layer construction as a fifth embodiment of a semiconductor laser element according to the present invention.

FIG. 6 shows a fifth embodiment of a semiconductor laser element according to the present invention. The semiconductor laser element of the fifth embodiment has the structure described below.

In FIG. 6, an n-type GaAs substrate 51 having 350 μm of thickness is formed thereon with an n-type GaAs buffer layer 52 having 0.5 μm of thickness, an n-type $In_{0.49}Ga_{0.5}As$ clad layer 53 having 1.5 μm of thickness, a main portion 60 including an active layer and a light confining layer, a p-type $In_{0.51}Ga_{0.49}P$ clad layer 55a having 0.2 μm of thickness and a p-type $In_{0.51}Ga_{0.49}P$ clad layer 55b having 1.3 μm of thickness, a p-type GaAs etching stop layer 61 interposed between both the p-type clad layers 55a and 55b, and a p-type contact layer 56 having 0.2 μm of thickness through the aforementioned epitaxial growth means.

The structure of the main portion 60 in FIG. 6 is the same as that mentioned in FIG. 2. Parts constituting the main portion 60 are indicated by reference numerals with [ ] in FIG. 2.

That is, in FIG. 2 also showing the main portion 60 in FIG. 4, two GaAs light confining layers 57 positioned up and down have 1500 Å of thickness, each GaAs barrier layer 58 between the light confining layers 7 has 100 Å of thickness, and each $In_{0.35}Ga_{0.65}As$ distortion quantum well layer 59 has 40 Å.

It is desired that the thickness of the etching stop layer 61 be less than 0.2 μm so as not to impair a light confining effect caused by the clad layer.

As a modified form of the fifth embodiment, in the same construction as that of the fifth embodiment, only the thickness of the etching stop layer 61 is set to 50 Å, and an absorption end of the etching stop layer 61 is sometimes shifted to a short wave side by the quantum effect.

In the method for production of a semiconductor laser element according to the present invention, the step of mesaforming a semiconductor laser element of the fifth embodiment is executed as described hereinafter.

First, when a GaAs contact layer 56 is subjected to etching, a mixed liquid of sulfuric acid and hydrogen peroxide is used.

The etching solution of the mixed solution varies with the conditions such as temperature, mixing ratio, stirring state of the solution.

However, since the etching speed of the GaAs by the mixed solution is 20 times or more of InGaP, such a mixed solution is used whereby only the GaAs can be etched.

Next, when an InGaP clad layer 57 is subjected to etching till reaching the etching stop layer 51, hydrochloric acid of 36% (weight percentage) is used.

The etching speed of InGaP by hydrochloric acid at 20° C. is approximately 0.1 μm/sec., and an InGaP layer having 1.3 μm of thickness can be etched in 13±2 seconds by using the hydrochloric acid.

On the other hand, the etching speed of GaAs by hydrochloric acid is so small that it cannot be measured, such as 0.1 A/sec.. For example, in case of GaAs layer of 50 Å, even if the etching time of 10 minutes has passed, it cannot be etched.

In this manner, by carrying out etching processing for 15 seconds using hydrochloric acid, the etching depth of the InGaP clad layer is less than a single atomic layer (3 Å).

Furthermore, if the aforementioned double hetero construction is prepared by a precise crystal growth method such as MCVD method and MBE method, a very flat film is obtained.

Incidentally, in the case where a device size is about 300 μm square, the flatness of atomic layer level can be obtained, and the error in film thickness is less than 1%.

Accordingly, in the mesa forming step of the present method, if such a double hetero construction is used, the depth of mesa can be designed within the range of an error less than 1%, and a ridge waveguide laser element of a strained quantum well construction having a flatness in which an etching bottom is at a level of an atomic layer can be easily prepared.

Double hetero constructions of the aforementioned fifth embodiment, the modified form and the prior art are prepared three times by use of the MOCVD method, and 100 ridge waveguide laser elements having a strained quantum well construction were prepared from wafers thereof.

With respect to the semiconductor laser elements of the fifth embodiment, the modified example and prior art, the oscillation threshold currents in 0.93±0.101 μm of oscillation wavelength were measured to obtain the results shown in Tables 3-1, 3-2 and 3-3 below.

TABLE 3-1

| (Fifth Embodiment) | | | |
|---|---|---|---|
| | 1st time | 2nd time | 2nd time |
| Ī th | 12.3 mA | 12.4 mA | 12.6 mA |
| σ Ith | 0.40 mA | 0.40 mA | 0.35 mA |

TABLE 3-2

| (Modified Example of Fifth Embodiment) | | | |
|---|---|---|---|
| | 1st time | 2nd time | 2nd time |
| Ī th | 10.2 mA | 9.7 mA | 10.1 mA |
| σ Ith | 0.35 mA | 0.35 mA | 0.40 mA |

TABLE 3-3

| (Prior Art) | | | |
|---|---|---|---|
| | 1st time | 2nd time | 2nd time |
| Ī th | 25.2 mA | 18.0 mA | 30.4 mA |
| σ Ith | 3.2 mA | 2.9 mA | 4.1 mA |

As will be apparent from the above tables, the double hetero construction according to the embodiments of the present invention is superior in the average value of the threshold current to that of prior art. Particularly, in the modified example of the fifth embodiment, since the absorption of the etching stop layer at 0.93 μm of oscillation wavelength is small, the threshold value is smaller that than of the fifth embodiment.

Moreover, the double hetero construction in the embodiment of the present invention shows favorable results as compared with prior art with respect to irregularities of thresholds, between batches as well as chips.

Figure 7:
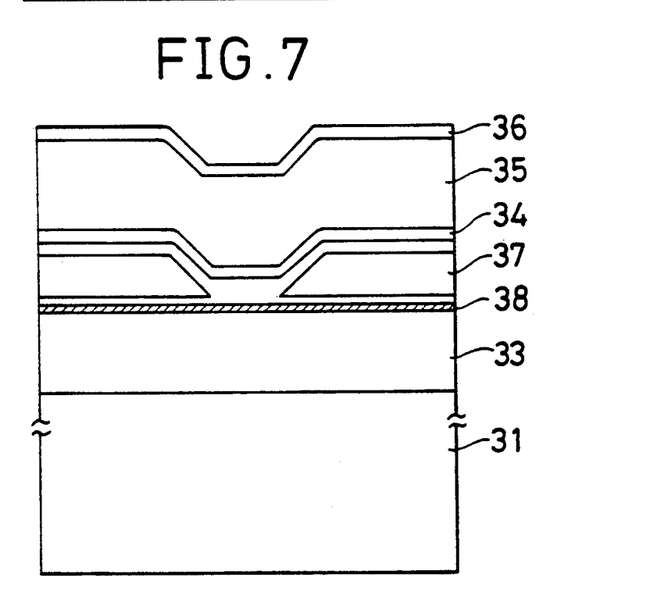
FIG. 7 is a sectional view showing an SBA type layer construction as a sixth embodiment of a semiconductor laser element according to the present invention.

While in the above-described embodiment, the ridge waveguide laser has been employed, it is to be noted that as a sixth embodiment, an etching stop layer can be provided also in the laser construction of SAB type illustrated in FIG. 7.

In FIG. 7, an n-type GaAs substrate 31 is formed thereon with an n-type InGaP clad layer 33, an etching stop layer 38, a p-type InGaP blocking layer 37, an active layer 34, an n-type InGaP clad layer 35 and an n-type GaAs contact layer 31.

In the etching step for preparing a SAB type semiconductor laser element of FIG. 7, as an etching liquid for selectively etching InGaP, a mixed solution of hydrochloric acid and phosphoric acid or hydrochloric acid and acetic acid is sometimes used.

The semiconductor laser element according to the present invention has the following effects.

According to a first effect, in a semiconductor laser element having a GaAs substrate formed thereon with an active layer of a strained quantum well construction provided with an $In_xGa_{1-x}As$ strained quantum well layer and a GaAs barrier layer, and clad layers arrange up and down of said active layer through epitaxial growth means, said clad layer is formed of $In_zGa_{1-z}As_yP_{1-y}$ and therefore strained quantum well type semiconductor laser element having a large output a long service life can be obtained.

In this case, if the lattice mismatching rate of the clad layer with respect to the substrate is less than $10^{-3}$, more favorable effect is obtained.

According to a further effect, in the aforementioned double hetero construction, since a stree relieving layer formed of $In_{1-z}Ga_zP$ is provided adjacent to the active layer, a strained quantum well type semiconductor laser element having a long service life can be obtained in view of the foregoing.

According to another effect, in a semiconductor laser element having a GaAs substrate formed thereon with an active layer of a strained quantum well construction provided with an $In_xGa_{1-x}As$ strained quantum well layer and a GaAs barrier layer and clad layers arranged up and down of said active layer througy an epitaxial growth means, said clad layer is formed of InGaP, and a GaAs etching stop layer is inserted into said clad layer, and therefore, such a double hetero construction is applied with etching processing whereby a distance between a mesa bottom and the active layer can be accurately controlled, and as a semiconductor, an irregularity of threshold current is reduced and a yield of product is enhanced.

Also in this case, if the lattice mismatching rate of the clad layer with respect to the substrate is less than $10^{-3}$, more favorable effect is obtained.

Moreover, according to the method for the production of the aforementioned semiconductor laser element according to the present invention, the method comprises the steps of etching a GaAs layer to an InGaP layer with an etching liquid containing either sulfuric acid, tartaric acid and ammonia and hydrogen peroxide and etching an InGaP layer to a GaAs layer with an etching liquid containing hydrochloric acid but not containing hydrogen peroxide. Therefore, first, said one etching liquid containing hydrogen peroxide can be used to selectively etch only the GaAs layer, and then, said other etching liquid not containing hydrogen peroxide is used to selectively etch the InGaP clad layer up to the GaAs etching stop layer whereby a semiconductor having an excellent characteristic can be easily prepared.

What is claimed is:

1. In a semiconductor laser element having a GaAs substrate formed thereon with an active layer of a strained quantum well construction provided with an $In_nGa_{1-x}As$, wherein $0 \leq x \leq 0.5$, strained quantum well layer and a GaAs barrier layer and clad layers arranged on the top and bottom surface of said active layer through an epitaxial growth means, said clad layer being formed of $In_zGa_{1-z}As_yP_{1-y}$, wherein $0 < z < 0.6$ and y is selected in a range of $0 < y < 1$.

2. In a semiconductor laser element according to claim 1, wherein a lattice mismatching rate of the clad layer with respect to the substrate is less than $10^{-3}$.

3. In a semiconductor laser element according to claim 1, wherein a stress relieving layer formed of $In_{1-z}Ga_zP$ (provided $z > 0.51$) is interposed between the active layer and both the clad layers arranged up and down thereof.

4. In a semiconductor laser element having a GaAs substrate formed thereon with an active layer of a strained quantum well construction provided with an $In_xGa_{1-x}As$ strained quantum well layer and a GaAs barrier layer and clad layers arranged on the top and bottom surface of said active layer through an epitaxial growth means, each of said clad layers being formed of InGaP, said clad layers having a GaAs etching stop layer inserted therein, said etching stop layer being less than 200 Å thick.

5. In a semiconductor laser element according to claim 4, wherein a lattice mismatching rate of the clad layer with respect to the substrate is less than $10^{-3}$.

* * * * *

UNITED STATES PATENT AND TRADEMARK OFFICE
CERTIFICATE OF CORRECTION

PATENT NO. : 5,155,738
DATED : October 13, 1992
INVENTOR(S) : Teturo IJICHI et al.

It is certified that error appears in the above-indentified patent and that said Letters Patent is hereby corrected as shown below:

On the title page, item (73) Assignee:

"FURAKAWA" should read --FURUKAWA--.

Signed and Sealed this

Twenty-seventh Day of December, 1994

Attest:

BRUCE LEHMAN

Attesting Officer     Commissioner of Patents and Trademarks